(12) United States Patent
Kujubu (10) Patent No.: US 7,797,660 B2
(45) Date of Patent: Sep. 14, 2010

(54) SEMICONDUCTOR INTEGRATED CIRCUIT FOR CONTROLLING SUBSTRATE BIAS

(75) Inventor: Junji Kujubu, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 360 days.

(21) Appl. No.: 11/892,585

(22) Filed: Aug. 24, 2007

(65) Prior Publication Data

US 2008/0074169 A1   Mar. 27, 2008

(30) Foreign Application Priority Data

Sep. 21, 2006   (JP) .............................. 2006-255194

(51) Int. Cl.
*G06F 17/50* (2006.01)
*G06F 9/455* (2006.01)
*H03K 17/693* (2006.01)
*H01L 29/94* (2006.01)

(52) U.S. Cl. .............................. 716/10; 716/11; 716/12; 716/14; 716/15; 257/207; 257/299; 257/901

(58) Field of Classification Search ............. 716/10–12, 716/14, 15; 257/207, 299, 901
See application file for complete search history.

(56) References Cited

U.S. PATENT DOCUMENTS

| 6,466,077 B1 * | 10/2002 | Miyazaki et al. ............. 327/534 |
| 6,611,943 B2 * | 8/2003 | Shibata et al. ................. 716/1 |
| 7,112,999 B2 * | 9/2006 | Mizuno et al. ................. 326/81 |
| 7,456,447 B2 * | 11/2008 | Tatsumi ...................... 257/207 |
| 7,531,849 B2 * | 5/2009 | Ryu et al. .................... 257/103 |
| 2008/0209371 A1 * | 8/2008 | Muraya et al. ................. 716/5 |

FOREIGN PATENT DOCUMENTS

| JP | 2000-150667 | 5/2000 |
| JP | 2001-148464 | 5/2001 |
| JP | 2004-342757 | 12/2004 |
| JP | 2000-150667 | 5/2007 |

* cited by examiner

*Primary Examiner*—Helen Rossoshek
(74) *Attorney, Agent, or Firm*—Arent Fox LLP (57) ABSTRACT

A semiconductor integrated circuit device which is improved in wiring efficiency and area efficiency. Metal layers having respective portions protruding out from an N-type diffusion layer and a P-type diffusion layer in plan view toward respective sides of the diffusion layers opposed to each other are formed over the N-type diffusion layer and the P-type diffusion layer, respectively, and contact portions are formed over the upper surfaces of the protruding portions of the metal layers such that they extend parallel to a power supply line and a ground voltage line. This produces empty spaces over the regions of the upper surfaces of the metal layers, which makes it possible to arrange a large number of conductive traces, and enhance wiring efficiency and space efficiency.

13 Claims, 8 Drawing Sheets

SEMICONDUCTOR INTEGRATED CIRCUIT FOR CONTROLLING SUBSTRATE BIAS

CROSS-REFERENCE TO RELATED APPLICATIONS

This application is based upon and claims the benefits of priority from the prior Japanese Patent Application No. 2006-255194 filed on Sep. 21, 2006, the entire contents of which are incorporated herein by reference.

BACKGROUND OF THE INVENTION

1. Field of the Invention

This invention relates to a semiconductor integrated circuit device, and more particularly to a semiconductor integrated circuit device that performs substrate bias control.

2. Description of the Related Art

The semiconductor integrated circuit device is formed by systematically arranging logic cells, such as standard cells or gate arrays, which are formed by transistors.

In such a semiconductor integrated circuit device, it is required to arrange not only power supply voltage lines for power supply and ground voltage lines for grounding, but also substrate potential lines for substrate bias control. For this reason, in each logic cell region, an area occupied e.g. by the substrate potential lines is large, and hence the area efficiency is degraded.

To solve such a problem, there has been proposed a technique described hereafter (see e.g. Japanese Laid-Open Patent Publication (Kokai) No. 2001-148464).

Figure 6:
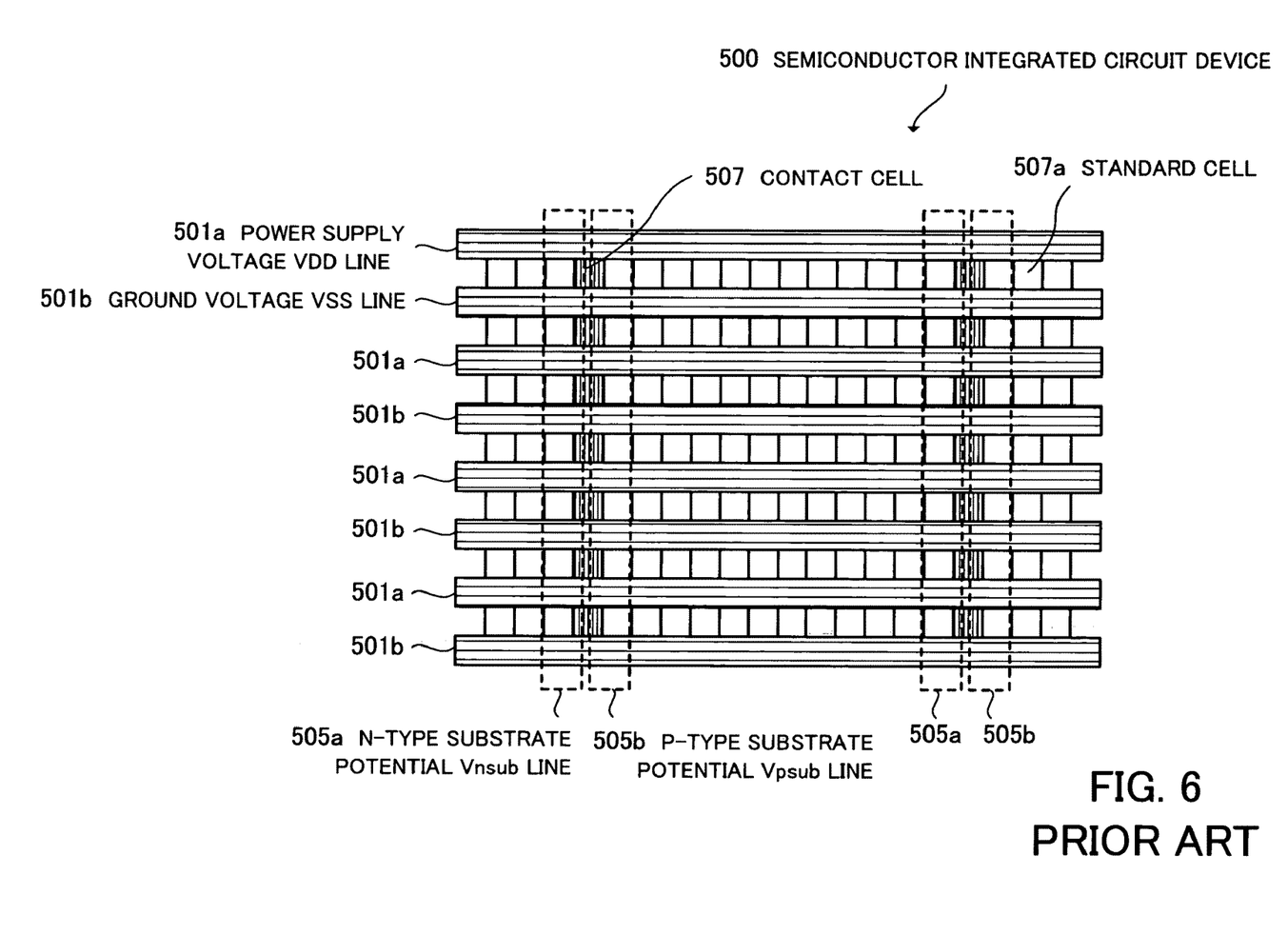
FIG. 6 is a schematic view of a conventional semiconductor integrated circuit device.

FIG. 6 is a schematic diagram of a conventional semiconductor integrated circuit device.

The semiconductor integrated circuit device 500 is comprised of power supply voltage $V_{DD}$ lines 501a and ground voltage $V_{SS}$ lines 501b alternately at predetermined space intervals along the lateral direction as viewed in FIG. 6. Standard cells 507a are arranged between the power supply voltage $V_{DD}$ lines 501a and the ground voltage $V_{SS}$ lines 501b along the lateral direction as viewed in FIG. 6.

A vertical length of each standard cell 507a as viewed in FIG. 6 is determined constant by the space interval between the power supply voltage $V_{DD}$ lines 501a and ground voltage $V_{SS}$ lines 501b. A lateral length X as viewed in FIG. 6 can be freely set in accordance with the area of each standard cell 507a In the standard cell 507a, P-channel transistors (not shown) operating upon receiving a power supply voltage $V_{DD}$ are formed in respective regions sandwiching the power supply voltage $V_{DD}$ line 501a. On the other hand, N-channel transistors (not shown) operating upon receiving a ground voltage $V_{SS}$ are formed in respective regions sandwiching the ground voltage $V_{SS}$ line 501b.

Further, an N-type substrate potential $V_{nsub}$ line 505a and a P-type substrate potential $V_{psub}$ line 505b are paired and formed in the vertical direction as viewed in FIG. 6 perpendicular to the power supply voltage $V_{DD}$ lines 501a and the ground voltage $V_{SS}$ lines 501b. Contact cells 507 are further arranged in the respective cell arrangement regions of the standard cells 507a. The contact cells 507 are continuously arranged in the vertical direction along the N-type substrate potential $V_{nsub}$ line 505a and P-type substrate potential $V_{psub}$ line 505b. An N-type substrate potential $V_{nsub}$ and a P-type substrate potential $V_{psub}$ are applied to an N-type substrate (not shown) and a P-type substrate (not shown), respectively, via the contact cells 507 from the N-type substrate potential $V_{nsub}$ line 505a and the P-type substrate potential $V_{psub}$ line 505b.

With the arrangement described above, in which the contact cells 507a are formed in the respective cell arrangement regions of the standard cells 507a, for substrate bias control, and the N-type substrate potential $V_{nsub}$ line 505a and the P-type substrate potential $V_{psub}$ line 505b are arranged in the vertical direction along the contact cells, so as to supply the N-type substrate potential $V_{nsub}$ and the P-type substrate potential $V_{psub}$. Thus, the area efficiency of the device can be improved.

Figure 7:
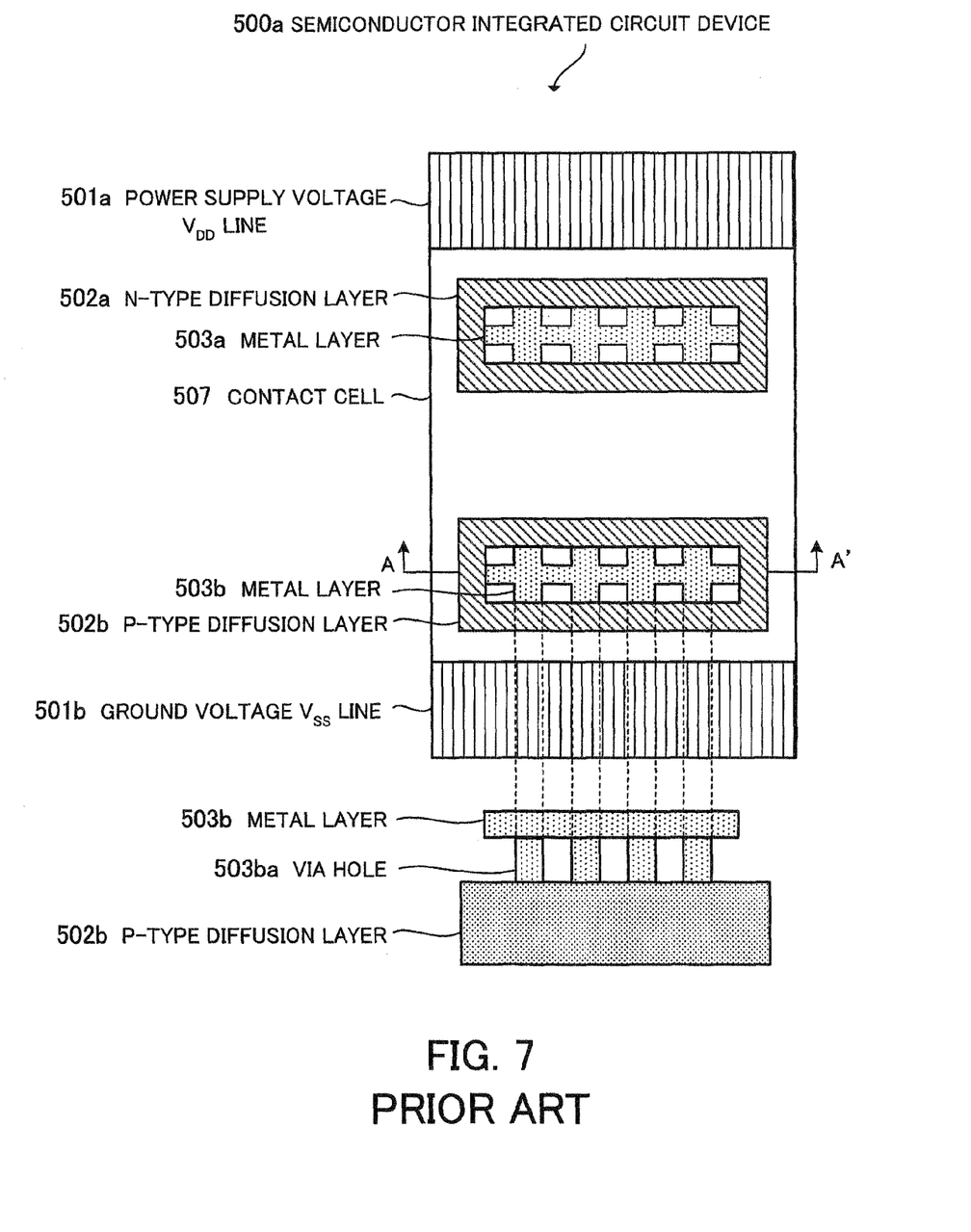
FIG. 7 is a schematic view of a contact cell of the conventional semiconductor integrated circuit device.
Figure 8:
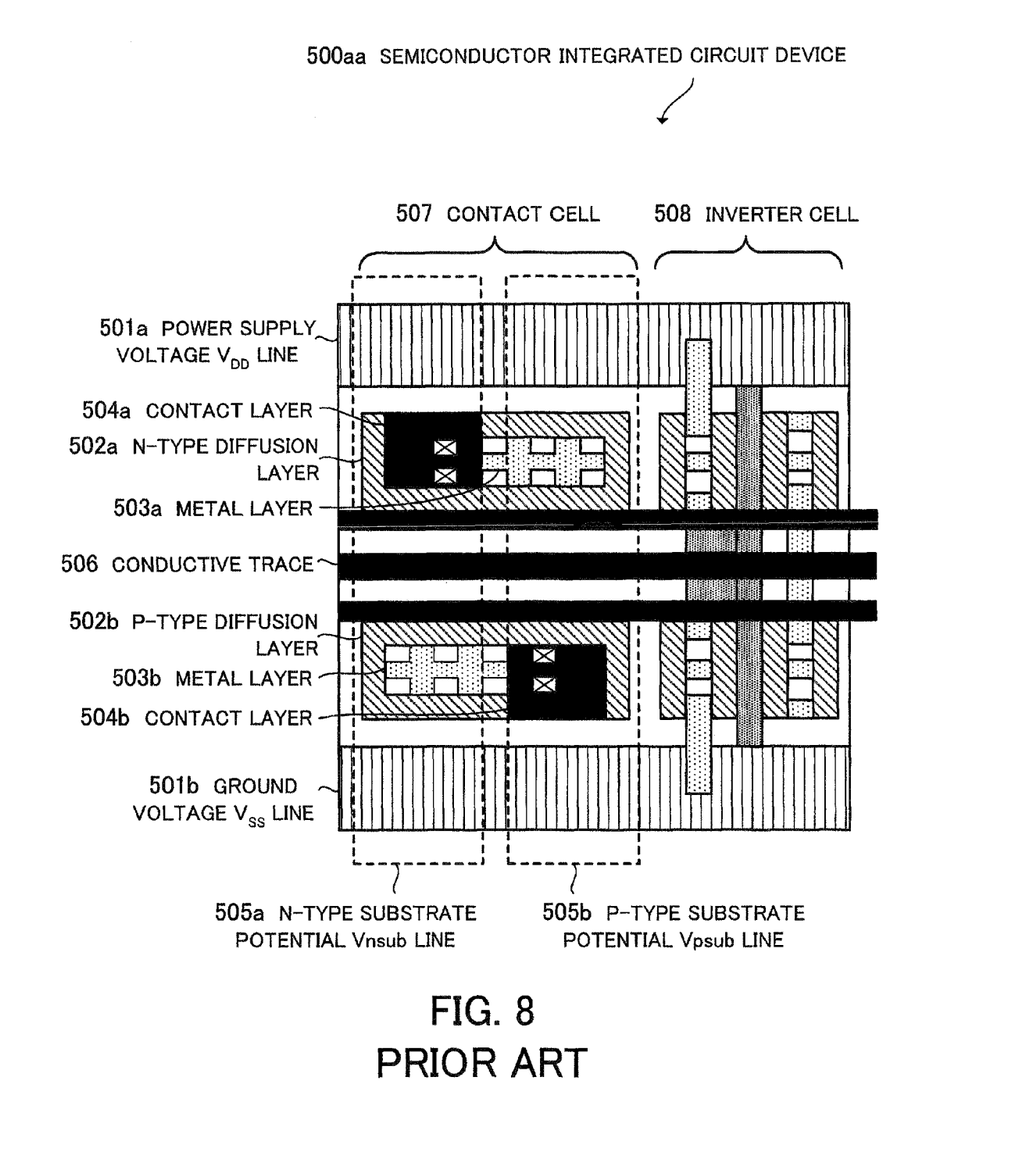
FIG. 8 is schematic view of the contact cell of the conventional semiconductor integrated circuit device, in a wired state.

However, the arrangement of the N-type substrate potential $V_{nsub}$ lines 505a and the P-type substrate potential $V_{psub}$ lines 505b along the contact cells 507 for substrate bias control suffers from the following problems:

FIG. 7 is a schematic diagram of a contact cell of the conventional integrated circuit device, and FIG. 8 is a schematic diagram of the contact cell in a wired state.

FIG. 7 shows a semiconductor integrated circuit device 500a in which the contact cell 507 sandwiched between the power supply voltage $V_{DD}$ line 501a and the ground voltage $V_{SS}$ line 501b is illustrated in enlarged scale, and an N-type dispersion layer 502a and a P-type dispersion layer 502b, and metal layers 503a and 503b are formed in the contact cell 507.

Further, a schematic cross-section taken on line A-A' of the metal layer 503b formed over the upper surface of the P-type dispersion layer 502b is also shown in a lower part of FIG. 7. From this figure, it is seen that the metal layer 503b is formed over the upper surface of the P-type dispersion layer 502b with via holes 503ba formed therebetween.

FIG. 8 schematically shows a semiconductor integrated circuit device 500aa in which wiring is actually performed on the contact cell 507 and an inverter cell 508 of the conventional semiconductor integrated circuit device shown in FIG. 7. This figure shows the contact cell 507 and the inverter cell 508 sandwiched between the power supply voltage $V_{DD}$ line 501a and the ground voltage $V_{SS}$ line 501b in enlarged scale. Similarly to FIG. 7, the N-type dispersion layer 502a and the P-type dispersion layer 502b, and the metal layers 503a and 503b are formed in the contact cell 507.

Further, in the contact cell 507, conductive traces 506 are disposed and the N-type substrate potential $V_{nsub}$ line 505a and the P-type substrate potential $V_{psub}$ line 505b are connected to contact layers 504a and 504b disposed over the surfaces of the N-type dispersion layer 502a and the P-type dispersion layer 502b, respectively (regions enclosed by dotted lines in FIG. 8 represent the N-type substrate potential $V_{nsub}$ line 505a and the P-type substrate potential $V_{psub}$ line 505b). Then, voltages are applied to substrates via the contact layers 504a and 504b using the N-type substrate potential $V_{nsub}$ line 505a and the P-type substrate potential $V_{psub}$ line 505b, whereby substrate bias control can be performed.

However, substrate bias control of the conventional semiconductor integrated circuit device 500aa is performed by supplying the voltages via the contact layers 504a and 504b using the N-type substrate potential $V_{nsub}$ line 505a and the P-type substrate potential $V_{psub}$ line 505b, as shown in FIG. 8. Therefore, it is required to secure regions over the upper surfaces of the N-type dispersion layer 502a and the P-type dispersion layer 502b, for use in arranging the contact layers 504a and 504b therein. Accordingly, areas over the upper surfaces of the N-type dispersion layer 502a and the P-type dispersion layer 502b are occupied by the contact layers 504a and 504b, which lowers wiring efficiency. The degraded wiring efficiency in turn can have adverse effects in the reduction of chip area.

SUMMARY OF THE INVENTION

The present invention has been made in view of the above problems, and an object thereof is to provide a semiconductor integrated circuit device which is improved in wiring efficiency and area efficiency.

To attain the above object, there is provided a semiconductor integrated circuit device that performs substrate bias control. The semiconductor integrated circuit device comprises a pair of opposed power supply lines that supply power supply voltage, a pair of dispersion layers that are disposed between the opposed power supply lines, a pair of conductive layers that are formed over respective upper surfaces of the dispersion layers, and have respective portions protruding out from the dispersion layers in plan view, toward respective sides of the dispersion layers opposed to each other, and a pair of contact portions that are formed over respective upper surfaces of the protruding portions of the conductive layers, such that the contact portions extend parallel to the power supply lines, and are connected to substrate potential lines that supply voltages for the substrate bias control.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

The invention will now be described in detail with reference to the drawings showing a preferred embodiment thereof.

Here, the outline of the present invention will be described first, and then, an embodiment to which the present invention is applied will be described. It should be noted that a top-bottom direction in each figure will be referred to as the vertical direction, a left-right direction in the same as the lateral direction, and a perpendicular direction as the height direction, assuming that the figure is a plan view, unless otherwise specified.

First, a description will be given of the outline of the semiconductor integrated circuit device according to the present invention.

Figure 1:
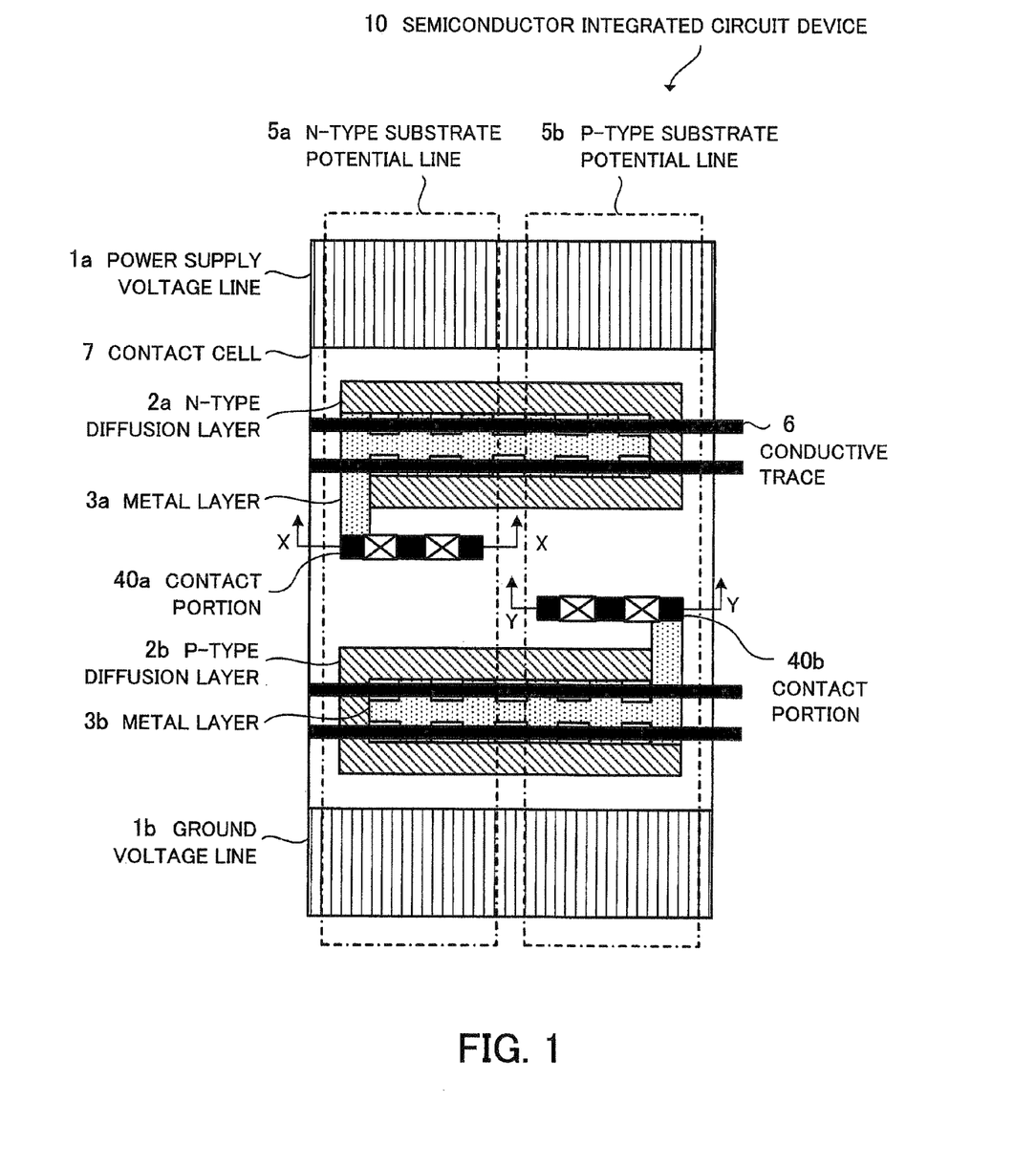
FIG. 1 is a plan view of a contact cell of a semiconductor integrated circuit device according to the present invention.
Figure 2:
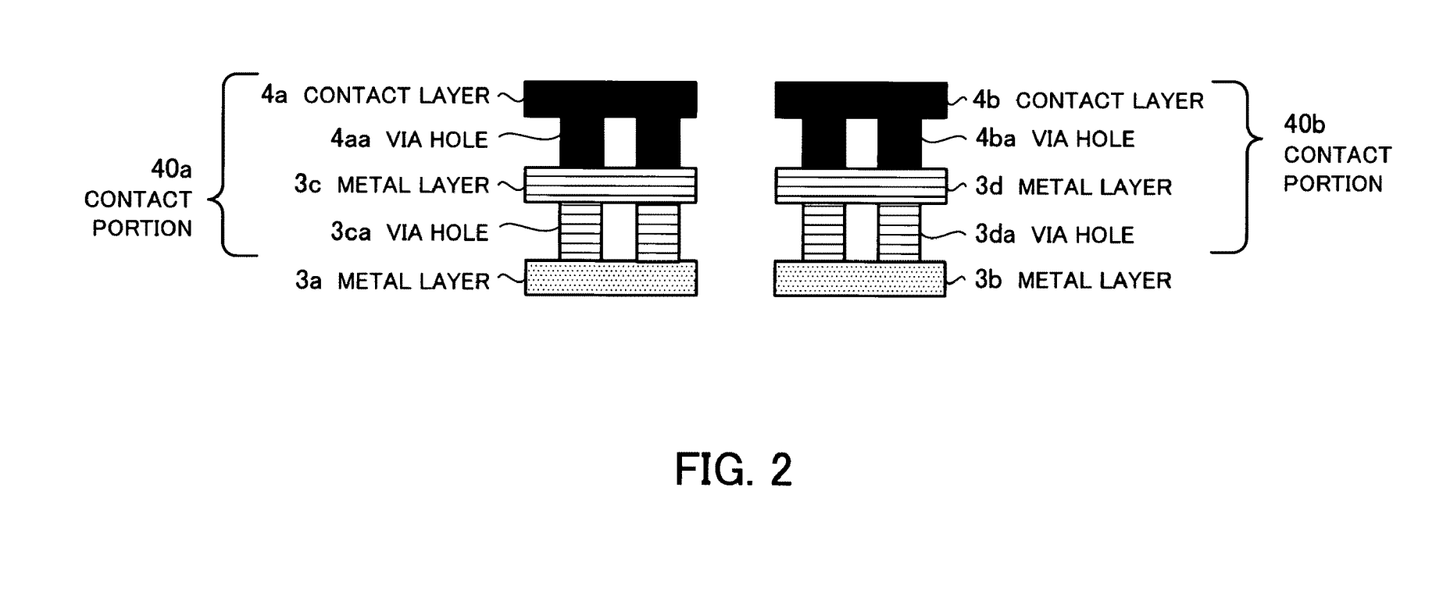
FIG. 2 is a cross-sectional view of the contact cell of the semiconductor integrated circuit device according to the present invention.

FIG. 1 is a plan view of a contact cell of a semiconductor integrated circuit device according to the present invention, and FIG. 2 is a cross-sectional view of the contact cell of the semiconductor integrated circuit device.

FIG. 1 illustrates the contact cell 7 sandwiched between a power supply voltage line 1a and a ground voltage line 1b, as a pair of power supply lines of the semiconductor integrated circuit device 10, in enlarged scale. The contact cell 7 is comprised of an N-type dispersion layer 2a and a P-type dispersion layer 2b as a pair of dispersion layers, metal layers 3a and 3b as a pair of conductive layers, and a pair of contact portions 40a and 40b. On the contact cell 7 described above, a plurality of conductive traces 6 are disposed.

It should be noted that an N-type substrate potential line 5a and a P-type substrate potential line 5b connected to the contact portions 40a and 40b, respectively, are represented by areas enclosed by dotted lines. Further, as illustrated in FIG. 6, the contact cell 7 may be arranged in the vertical direction as viewed in the figure, or may be randomly arranged insofar as it conforms to deign rules.

FIG. 2 shows cross-sections of the contact portions 40a and 40b taken on lines X-X and Y-Y in FIG. 1, respectively. As is apparent from FIG. 2, contact layers 4a and 4b, as first contact conductive layers, formed of an electrically conductive material, and metal layers 3c and 3d as second contact conductive layers, and the metal layers 3a and 3b are arranged in layers with via holes 4aa and 4ba and via holes 3ca and 3da formed therebetween, to form the contact portions 40a and 40b.

Hereinafter, the outline of the present invention will be described in detail with reference to FIGS. 1 and 2.

In FIG. 1, the metal layers 3a and 3b are formed over the upper surfaces of the N-type dispersion layer 2a and the P-type dispersion layer 2b of the contact cell 7, respectively. Further, the metal layers 3a and 3b have portions formed such that they protrude, in plan view, from the N-type dispersion layer 2a and the P-type dispersion layer 2b, respectively.

As shown in FIG. 2, the metal layers 3c and 3d are formed over the upper surfaces of the respective protruding portions of the metal layers 3a and 3b, with the via holes 3ca and 3da formed therebetween, and further, the contact layers 4a and 4b are formed over the upper surfaces of the metal layers 3c and 3d, with the via holes 4aa and 4ba formed therebetween, whereby the contact portions 40a and 40b are constructed.

With the arrangement described above, the metal layers 3c and 3d and the power supply voltage line 1a and the ground voltage line 1b are located on the same layer level. This makes it possible to effect connection therebetween only by short-circuiting the contact layers 4a and 4b to the N-type substrate potential line 5a and the P-type substrate potential line 5b, respectively.

It should be noted that the width of layers not lower than the metal layers 3c and 3d is set to the minimum width permitted by design rules concerning the design of the semiconductor integrated circuit device 10. However, it is possible to adjust the width of the layers not lower than the metal layers 3c and 3d, within a range in which adjacent wiring resources are not lost.

Further, by taking into consideration connections to the N-type substrate potential line 5a and the P-type substrate potential line 5b, the horizontal spacing between the layers not lower than the metal layers 3c and 3d is set to the minimum spacing permitted by the design rules concerning the design of the semiconductor integrated circuit device 10. However, it is possible to adjust the horizontal spacing between the layers not lower than the metal layers 3c and 3d, within a range in which the area of the contact cell 7 is not increased.

Further, the length of the layers not lower than the metal layers 3c and 3d is set to the minimum length permitted by the design rules concerning the design of the semiconductor integrated circuit device 10, and is not more than the width of the N-type substrate potential line 5a and the P-type substrate potential line 5b. However, it is possible to adjust the length of the layers not lower than the metal layers 3c and 3d, within a range in which the area of the contact cell 7 is not increased.

In the contact cell 7 described above, it is possible to dispose the conductive traces 6 such that they extend parallel to the contact lines 40a and 40b, in plan view, over the upper surfaces of the N-type dispersion layer 2a and the P-type dispersion layer 2b.

Then, as shown in FIG. 1, by arranging the N-type substrate potential line 5a and the P-type substrate potential line 5b such that they are connected to the contact portions 40a and 40b, potentials are supplied from the contact layers 4a and 4b to the metal layers 3a and 3b via the via holes 4aa and 4ba, the metal layers 3c and 3d, and the via holes 3ca and 3da. The voltages are thus supplied to the associated substrates via the contact portions 40a and 40b, which makes it possible to perform substrate bias control.

Conventionally, to perform substrate bias control, the contact portions connected to the N-type substrate potential line and the P-type substrate potential line are arranged over the upper surfaces of the N-type dispersion layer and the P-type dispersion layer, as shown in FIG. 8. Therefore, due to the use of the regions over the upper surfaces of the N-type dispersion layer and the P-type dispersion layer for arranging the contact portions therein, there is little space for disposing conductive traces over the upper surfaces of the N-type dispersion layer and the P-type dispersion layer, so that wiring efficiency is lowered.

In contrast, according to the present invention, the metal layers 3a and 3b are formed over the upper surfaces of the N-type dispersion layer 2a and the P-type dispersion layer 2b, and the metal layers 3a and 3b are extended out from the N-type dispersion layer 2a and the P-type dispersion layer 2b, in plan view, whereby the contact portions 40a and 40b are arranged over the upper surfaces of the respective extended portions of the metal layers 3a and 3b. This enables empty spaces to be secured over the upper surfaces of the N-type dispersion layer 2a and the P-type dispersion layer 2b. Due to the empty spaces secured over the upper surfaces of the N-type dispersion layer 2a and the P-type dispersion layer 2b, it is possible to dispose lots of conductive traces 6 thereover, and hence it is possible to improve wiring efficiency and space efficiency.

It should be noted that in the present invention, wiring efficiency is markedly improved in the case where the contact portions 40a and 40b over the upper surfaces of the metal layers 3a and 3b are disposed on the same wiring grid.

Hereafter, this case will be described as a semiconductor integrated circuit device according to an embodiment of the present invention, by way of example.

Figure 3:
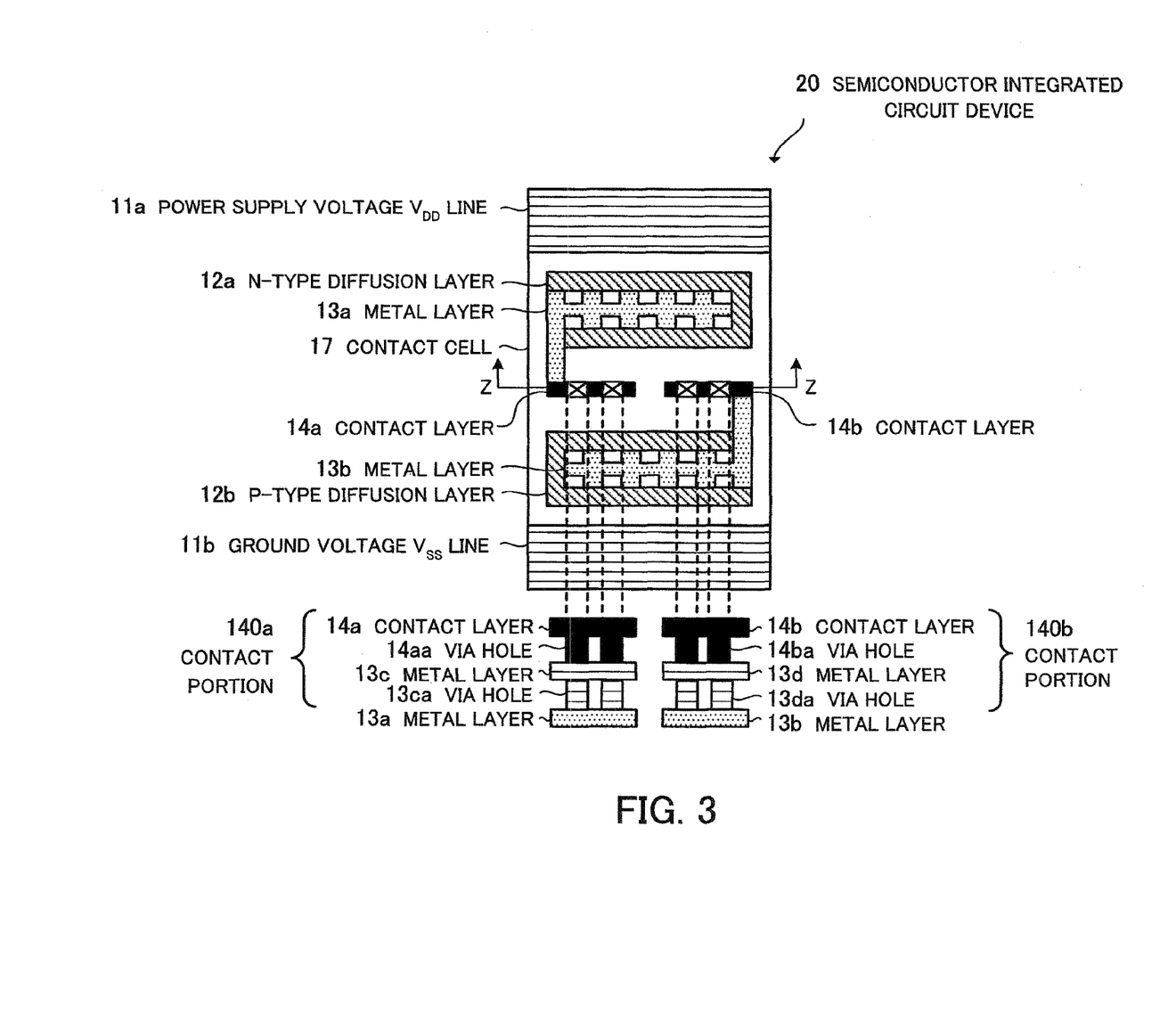
FIG. 3 is a plan view and cross-sectional view of a contact cell of a semiconductor integrated circuit device according to an embodiment of the present invention.
Figure 4:
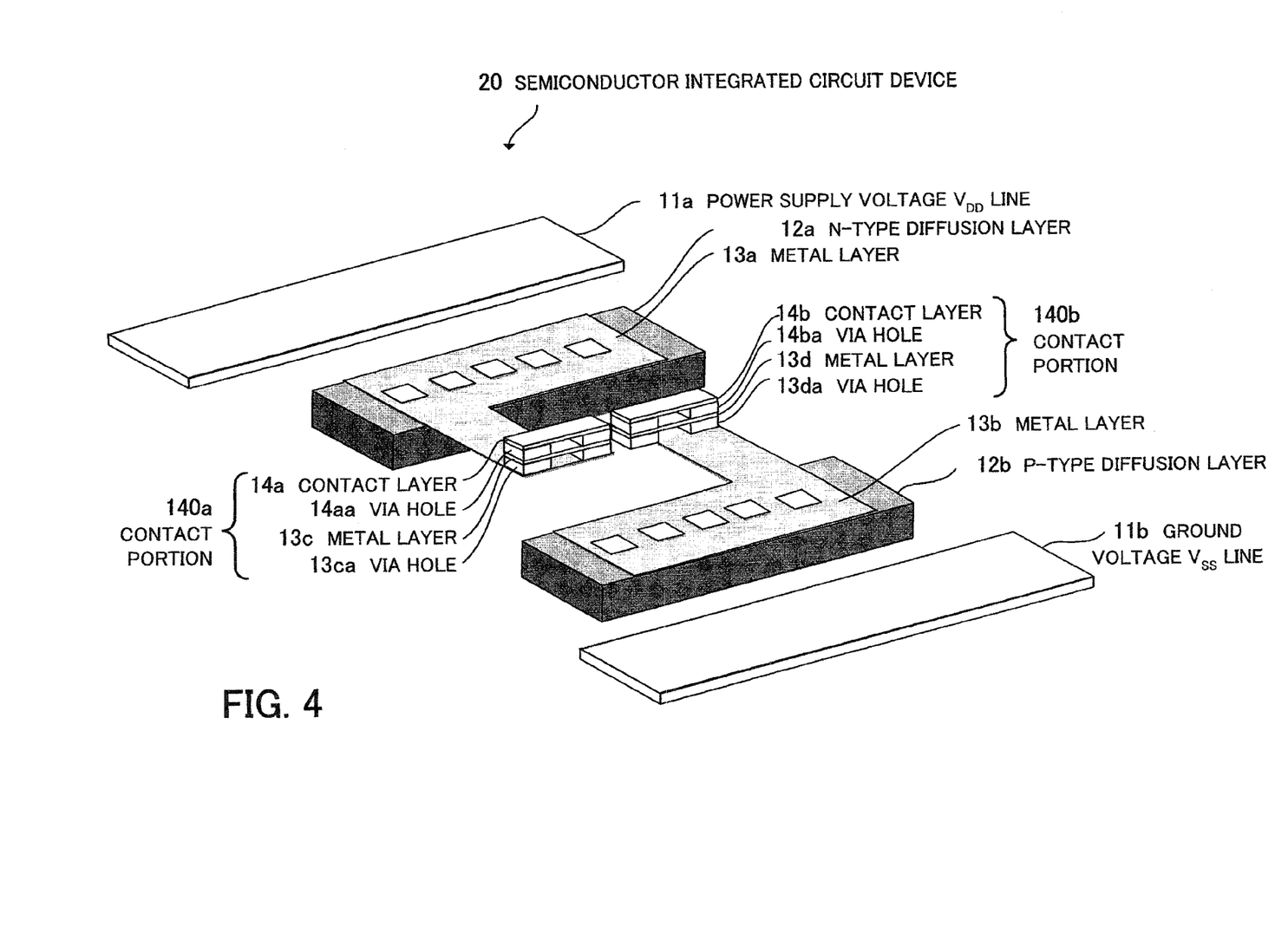
FIG. 4 is a perspective view of the contact cell of the semiconductor integrated circuit device according to the embodiment.

FIG. 3 is a plan view and cross-sectional view of a contact cell of a semiconductor integrated circuit device according to an embodiment of the present invention, and FIG. 4 is a perspective view of the contact cell of the semiconductor integrated circuit device according to the embodiment.

The present embodiment is distinguished from the description of the outline of the present invention in that the contact portions are arranged on the same wiring grid.

FIG. 3 illustrates a power supply voltage $V_{DD}$ line 11a and a ground voltage $V_{SS}$ line 11b as a pair of power supply lines, and a contact cell 17 sandwiched therebetween, in enlarged scale. The contact cell 17 is comprised of an N-type dispersion layer 12a and a P-type dispersion layer 12b as a pair of dispersion layers, a pair of metal layers 13a and 13b, and a pair of contact portions 140a and 140b. It should be noted that the contact cell 17 may be arranged in the vertical direction as in FIG. 6, or may be randomly arranged insofar as it conforms to deign rules.

Further, FIG. 3 shows cross-sections taken on lines Z-Z of the contact portions 140a and 140b in a lower part of the figure. As is apparent from FIG. 3, the contact layers 14a and 14b, as first contact conductive layers, which are formed of an electrically conductive material, the metal layers 13c and 13d, as second contact conductive layers, and the metal layers 13a and 13b are arranged in layers with via holes 14aa and 14ba and via holes 13ca and 13da formed therebetween, to form contact portions 140a and 140b.

Further, FIG. 4 is a perspective view of FIG. 3 as viewed obliquely from above, and shows the same arrangement of the components of the semiconductor integrated circuit device as that of FIG. 3.

In FIGS. 3 and 4, metal layers 13a and 13b are formed over the upper surfaces of the N-type dispersion layer 12a and the P-type dispersion layer 12b of the contact cell 17, respectively. Further, the metal layers 13a and 13b have portions formed such that they protrude, in plan view, from the N-type dispersion layer 12a and the P-type dispersion layer 12b, respectively.

The metal layers 13c and 13d are formed over the upper surfaces of the respective protruding portions of the metal layers 13a and 13b, with the via holes 13ca and 13da formed therebetween, and further, the contact layers 14a and 14b are formed over the upper surfaces of the metal layers 13c and 13d, with the via holes 14aa and 14ba formed therebetween, whereby the contact portions 140a and 140b are constructed.

With the arrangement described above, the metal layers 13c and 13d and the power supply voltage $V_{DD}$ line and the ground voltage $V_{SS}$ line are located on the same layer level. This makes it possible to effect connection therebetween only by short-circuiting the contact layers 14a and 14b to the N-type substrate potential $V_{nsub}$ line and the P-type substrate potential $V_{psub}$ line, respectively.

It should be noted that the width of layers not lower than the metal layers 13c and 13d is set to the minimum width permitted by design rules concerning the design of the semiconductor integrated circuit device 20. However, it is possible to adjust the width of the layers not lower than the metal layers 13c and 13d, within a range in which adjacent wiring resources are not lost.

Further, by taking into consideration connections to the N-type substrate potential $V_{nsub}$ line and the P-type substrate potential $V_{psub}$ line, the horizontal spacing between the layers not lower than the metal layers 13c and 13d is set to the minimum spacing permitted by the design rules concerning the design of the semiconductor integrated circuit device 20. However, it is possible to adjust the horizontal spacing between the layers not lower than the metal layers 13c and 13d, within a range in which the area of the contact cell 17 is not increased.

Further, the length of the layers not lower than the metal layers 13c and 13d is set to the minimum length permitted by the design rules concerning the design of the semiconductor integrated circuit device 20, and is not more than the width of the N-type substrate potential $V_{nsub}$ line and the P-type substrate potential $V_{psub}$ line. However, it is possible to adjust the length of the layers not lower than the metal layers 13c and 13d, within a range in which the area of the contact cell 17 is not increased.

In the contact cell 17 described above, it is possible to dispose the conductive traces 16 such that they extend parallel to the contact lines 140a and 140b, in plan view, over the upper surfaces of the N-type dispersion layer 12a and the P-type dispersion layer 12b.

Then, by arranging the N-type substrate potential $V_{nsub}$ line and the P-type substrate potential $V_{psub}$ line such that they are connected to the contact portions 140a and 140b, potentials are supplied from the contact layers 14a and 14b to the metal layers 13a and 13b via the via holes 14aa and 14ba, the metal layers 13c and 13d, and the via holes 13ca and 13da. The voltages are thus supplied to the associated substrates via the contact portions 140a and 140b, which makes it possible to perform substrate bias control.

Next, a description will be given of the case where wiring is performed on the contact cell according to the present invention.

Figure 5:
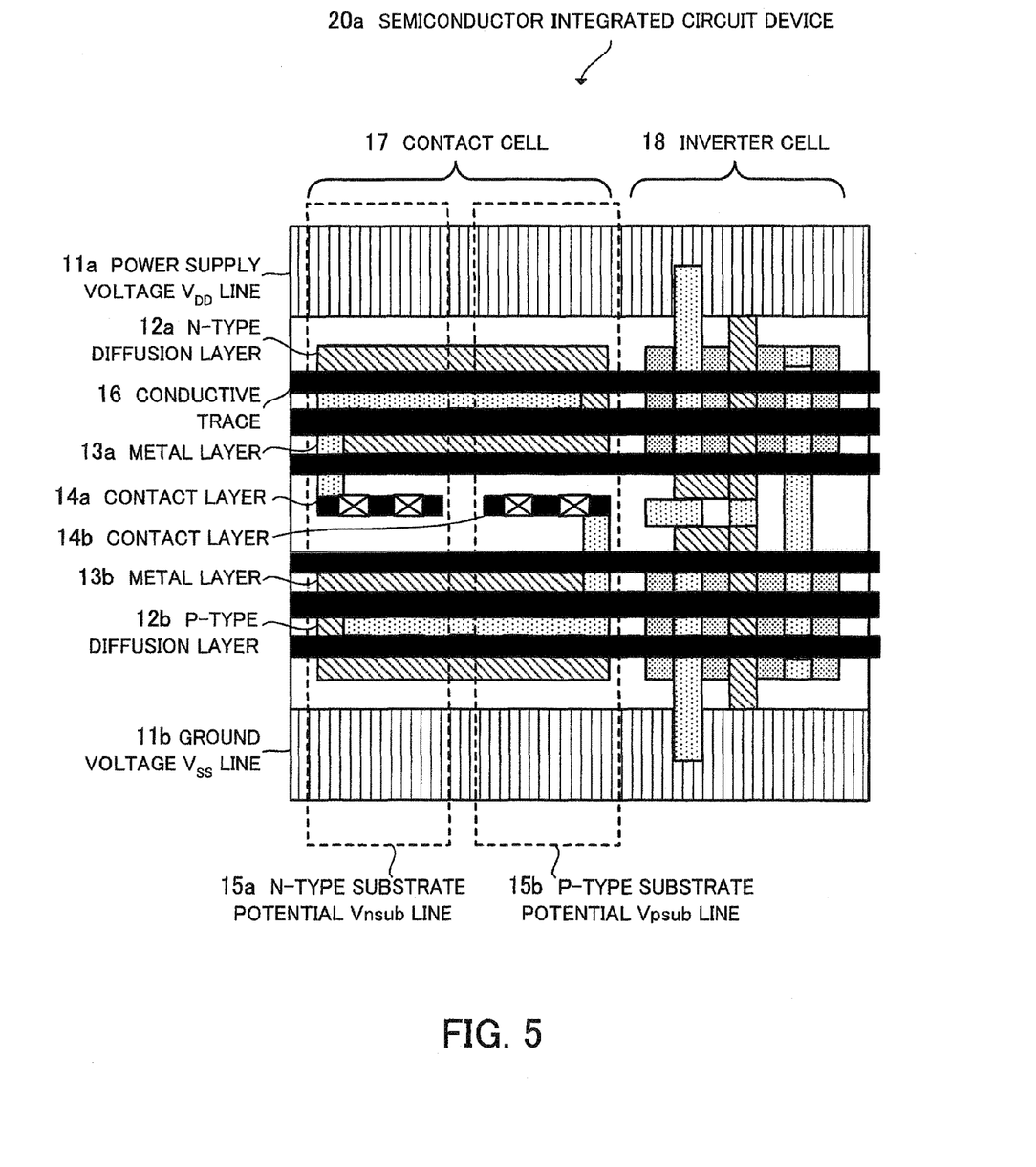
FIG. 5 is a schematic view of the contact cell of the semiconductor integrated circuit device according to the embodiment, in a wired state.

FIG. 5 is a schematic view of the contact cell of the semiconductor integrated circuit device according to the embodiment, in a wired state.

FIG. 5 shows a part of the semiconductor integrated circuit device 20a in the wired state in which wiring is performed on the contact cell 17 shown in FIGS. 3 and 4, and an inverter cell 18 added thereto.

In FIG. 5, there are shown, in enlarged scale, the contact cell 17 and the inverter cell 18 sandwiched between the power supply voltage $V_{DD}$ line 11a and the ground voltage $V_{SS}$ line 11b. In this contact cell 17, similarly to FIGS. 3 and 4, there are formed the N-type dispersion layer 12a and the P-type dispersion layer 12b, the metal layers 13a and 13b, and the contact layers 14a and 14b.

Further, in the contact cell 17, the conductive traces 16 are disposed over the upper surfaces of the N-type dispersion layer 12a and the P-type dispersion layer 12b, such that they extend parallel to the contact portions 140a and 140b. The N-type substrate potential $V_{nsub}$ line 15a and the P-type substrate potential $V_{psub}$ line 15b are connected to the contact portions 140a and 140b disposed over the upper surfaces of the N-type dispersion layer 12a and the P-type dispersion layer 12b, respectively (regions enclosed by dotted lines in FIG. 5 represent the N-type substrate potential $V_{nsub}$ line 15a and the P-type substrate potential $V_{psub}$ line 15b).

Then, voltages are applied to the associated substrates via the contact portions 140a and 140b using the N-type substrate potential $V_{nsub}$ line 15a and the P-type substrate potential $V_{psub}$ line 15b, whereby the substrate bias control can be performed.

Thus, by arranging the contact portions 140a and 140b in a straight line on the same grid, it is possible to dispose a larger number of conductive traces 16 thereover, and hence it is possible to improve wiring efficiency and space efficiency, compared with the case of the description of the outline of the present invention.

According to the present invention, over the upper surfaces of dispersion layers, there are formed a pair of conductive layers having respective portions protruding out from the dispersion layers in plan view toward respective sides of the dispersion layers opposed to each other, and over the upper surfaces of the respective protruding portions of the conductive layers, there are formed a pair of contact portions such that they extend parallel to power supply lines. Therefore, empty spaces are produced over the regions of the upper surfaces of the conductive layers, which makes it possible to dispose a large number of conductive traces over the upper surfaces of the conductive layers, and improve wiring efficiency and space efficiency.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor integrated circuit device, comprising:
   a pair of opposed power supply lines that supply power supply voltage;
   a first diffusion layer and a second diffusion layer that are disposed between said opposed power supply lines, the first diffusion layer being different from the second diffusion layer;
   a first conductive layer that is coupled to the first diffusion layer and has a first portion which does not exist over the first diffusion layer and is formed at a side of the second diffusion layer;
   a second conductive layer that is coupled to the second diffusion layer and has a second portion which does not exist over the second diffusion layer and is formed at a side of the first diffusion layer;
   a first contact portion that is formed over the first portion, extends parallel to the power supply lines and is coupled to a substrate potential line; and
   a second contact portion that is formed over the second portion, extends parallel to the power supply lines and is coupled to the substrate potential line.

2. The semiconductor integrated circuit device as claimed in claim 1, wherein the first contact portion and the second contact portion are arranged on a same wiring grid.

3. The semiconductor integrated circuit device as claimed in claim 1, wherein the first conductive layer and the second conductive layer are metal layers.

4. The semiconductor integrated circuit device as claimed in claim 1, further comprising:
   a first conductive trace that is disposed over the first diffusion layer and extends parallel to the first contact portion; and
   a second conductive trace that is disposed over the second diffusion layer and extends parallel to the second contact portion.

5. The semiconductor integrated circuit device as claimed in claim 4, wherein the first contact portion includes a first contact conductive layer coupled to the substrate potential line and a second contact conductive layer coupled to the first contact conductive layer via a first via hole and coupled to the first conductive layer via a second via hole.

6. The semiconductor integrated circuit device as claimed in claim 5, wherein said first contact conductive layer is a metal layer.

7. The semiconductor integrated circuit device as claimed in claim 5, wherein said second contact conductive layer is a metal layer.

8. The semiconductor integrated circuit device as claimed in claim 5, wherein a layer level of said second contact conductive layer is the same as a layer level of said power supply lines.

9. The semiconductor integrated circuit device as claimed in claim 5, wherein a width of layers not lower than said second contact conductive layer is a minimum width defined according to design rules.

10. The semiconductor integrated circuit device as claimed in claim 5, wherein horizontal spacing between layers not lower than said second contact conductive layer is a minimum spacing defined according to design rules.

11. The semiconductor integrated circuit device as claimed in claim 5, wherein a length of layers not lower than said second contact conductive layer is a minimum length defined according to design rules.

12. The semiconductor integrated circuit device as claimed in claim 11, wherein said length of layers not lower than said second contact conductive layer is not larger than a width of said substrate potential lines.

13. The semiconductor integrated circuit device as claimed in claim 1, wherein a substrate bias is controlled by supplying a voltage to a substrate via the first contact portion and the second contact portion.

* * * * *